United States Patent [19]
Arai

[11] Patent Number: 5,502,418
[45] Date of Patent: Mar. 26, 1996

[54] VOLTAGE-CONTROLLED OSCILLATING CIRCUIT

[75] Inventor: Yasuo Arai, Tsukuba, Japan

[73] Assignee: National Laboratory for High Energy Physics, Tsukuba, Japan

[21] Appl. No.: 380,580

[22] Filed: Jan. 30, 1995

[30] Foreign Application Priority Data

Apr. 7, 1994 [JP] Japan ................................ 6-069507

[51] Int. Cl.⁶ ........................ H03B 5/24; H03K 3/353; H03L 7/099
[52] U.S. Cl. ................ 331/57; 331/34; 331/45; 331/74; 331/177 R; 327/152
[58] Field of Search ..................... 331/1 A, 8, 34, 331/45, 57, 74, 111, 143, 177 R, DIG. 3; 327/152, 159, 295

[56] References Cited

U.S. PATENT DOCUMENTS

3,708,757 1/1973 Savarese et al. ............. 331/57
4,617,529 10/1986 Suzuki ........................ 331/57
4,804,929 2/1989 Kato et al. ................... 331/57

*Primary Examiner*—David Mis
*Attorney, Agent, or Firm*—Spencer & Frank

[57] ABSTRACT

The present invention provides a voltage controlled oscillating circuit comprising a multi-staged phase inversion circuit composed of 4 or more even-number stages of phase inversion devices connected in series; and a switch circuit having a delay time characteristic similar to that of said phase inversion circuit, wherein the switch circuit satisfies oscillation conditions by converting an output phase of the even-numbered inverters connected in series into a phase that is the same as those of the outputs of odd-numbered inverters connected in series; thereby obtaining timing signals having a period equal to 1/N of the oscillation period.

2 Claims, 7 Drawing Sheets

FIG_4A

VOLTAGE-CONTROLLED OSCILLATING CIRCUIT

BACKGROUND OF THE INVENTION

1. Field of the Invention

The present invention relates to a voltage-controlled oscillating circuit to be used in a phase locked loop (PLL) circuit, which has played an important role in a high-speed signal processing circuit that requires high-speed, high-precision control of timing signals; and more particularly to a voltage-controlled oscillating circuit wherein a timing signal has a period of one even-numberth of the oscillation period.

2. Description of the Related Art

The art of high-speed, high-precision controlling of timing signals has been one of the most important technologies in various electronics devices. Especially, in high energy physics experiments that require the processing of highly frequent output signals coming out of a detector, it is necessary to control and measure high-speed, high-precision signals in both an accelerator and the detector.

On the other hand, in the technical fields of electronic apparatus, there has been a significant advance in the wide band system of video apparatus and enhancement of speed in computers and information transmission networks. Accordingly, there has been also required a further improved high-speed processing of digital signals in these technological fields.

Figure 1:
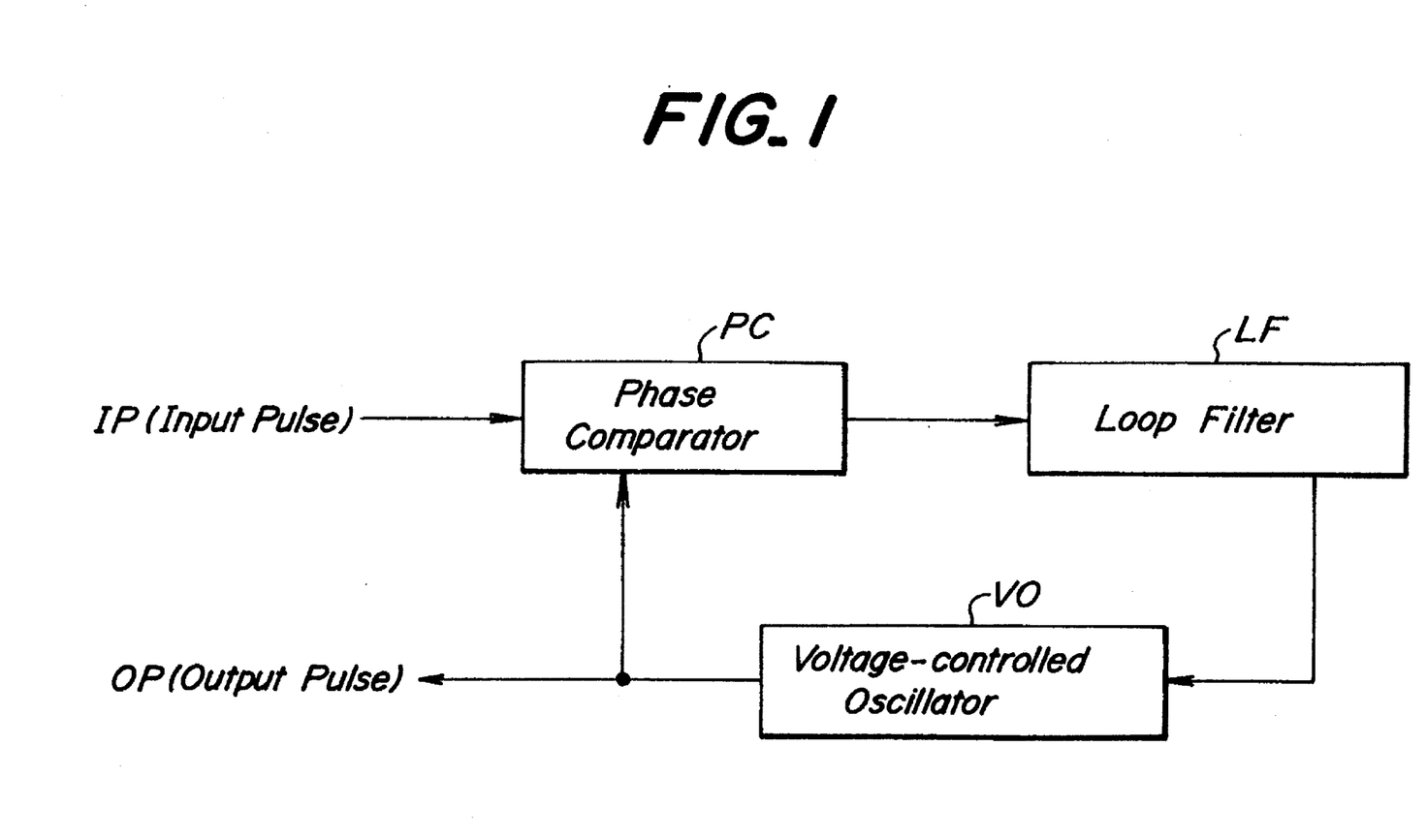
FIG. 1 is a block diagram illustrating a constitution of a phase locked loop (PLL) circuit.

A conventional phase locked loop (PLL) circuit, which plays an important role in the above-mentioned high-speed signal processing, has the construction shown in FIG. 1. Namely, the output pulse of a voltage-controlled oscillator (VO) is supplied to a the phase comparator (PC), wherein the frequency and phase of the output pulse is compared with those of an input pulse (IP), then a phase difference detected as a comparison output is supplied to a the loop filter (LF) in order to derive a phase error voltage to be fed back to the voltage-controlled oscillator (VO) to control the oscillation frequency, thereby obtaining an output pulse (OP) whose phase is locked to that of the input pulse (IP). With the above PLL circuit, there can be attained, if necessary, an output pulse (OP) having a frequency equal to the value obtained by multiplying the frequency of the input pulse (IP) by an integer M or dividing the frequency by M.

Figure 2:
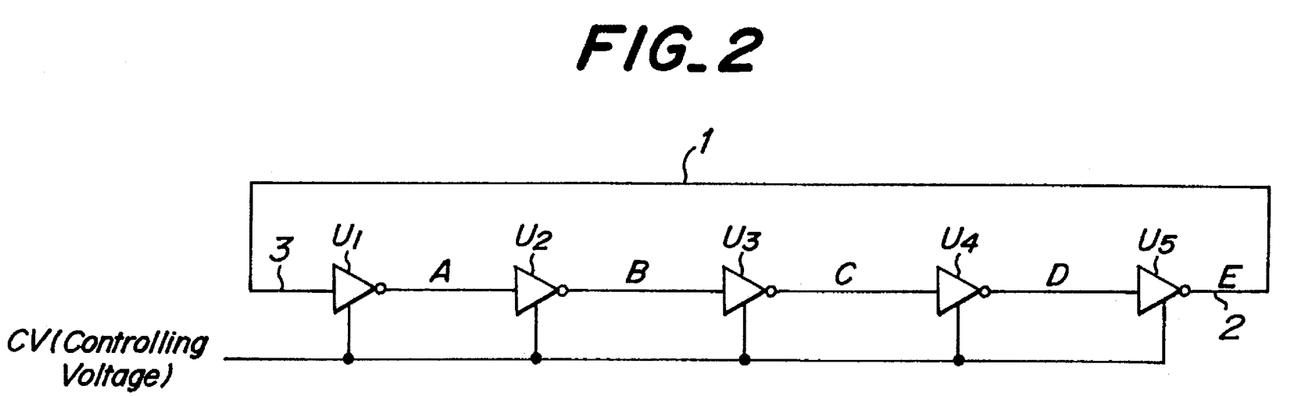
FIG. 2 is a diagram illustrating a conventional voltage-controlled oscillating circuit and FIGS. 2A, 2B, 2C, 2D and 2E are waveforms of pulses in respective stages thereof.
Figures 2A, 2B:
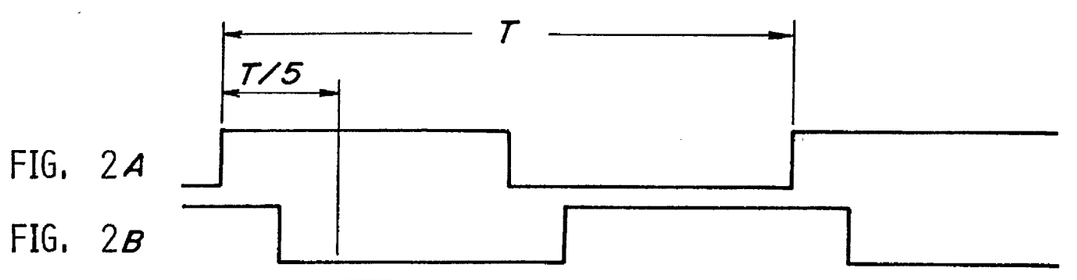
Figure 2C:
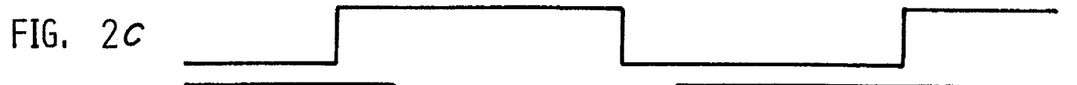
Figures 2D, 2E:
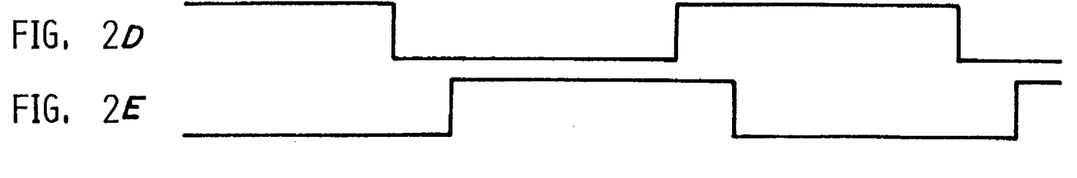

In particular, when a so-called ring oscillator 1 as shown in FIG. 2, wherein an output pulse of a multi-staged phase inversion circuit is fed back to the input side of the circuit, and a propagation delay time in respective devices can be controlled by an applied voltage, is used therein as the voltage-controlled oscillator VO, there can be obtained a timing signal having a time interval shorter than the oscillation output period T by deriving an output pulse from each inverter U at respective stages. For example, in the ring oscillator 1 having five stages of inverters $U_1$–$U_5$ connected in series as shown in FIG. 2, there are generated oscillation pulses FIGS. 2A, 2B, 2C, 2D and 2E each of which repeats bistable phase inversion with a period T. The phase inversion output A–E of respective inverters $U_1$–$U_5$ delay from the immediately preceding one with the same time intervals as shown in the figure. For instance, the adjoining leading edges in the phase inversion outputs A and C have a time interval therebetween that is equal to one-fifth of the oscillation period T.

In order to oscillate the ring oscillator 1, it is necessary to fulfill such oscillation condition that the output 2 of the last stage should have an inverted level of the first stage input 3 during a preceding cycle. Accordingly, the number of inverters connected in series should be an odd number in order to oscillate the ring oscillator 1. As a result, there is only obtained a timing signal having a period equal to one odd-numberth of the oscillation period. On the other hand, in many controlling circuits or measuring circuits, there is required timing pulses having a time interval with a period equal to one even-numberth of the oscillation period. In particular, there has been a great demand for timing signals having a period equal to $\frac{1}{2^n}$ of an oscillation period in the field of digital signal processing. As described above, however, conventional voltage-controlled oscillating circuits have not been able to meet these requirements since they have to include odd-numbered inverters connected in series.

Meanwhile, an output signal detected by a detector for a high energy beam particle such as a wire chamber needs to be measured with a precision of not more than 1 ns. If it is intended to conduct such a precision measurement through a direct method, it is necessary to utilize a clock signal having a high frequency of 1 GHz or more. This is difficult to realize in practice; and even if possible, the cost would amount to a significantly large sum.

In this connection, it may be possible to directly produce a clock signal having a frequency of around 100 MHz in a CMOS integrated circuit, if a phase locked loop (PLL) circuit is introduced into the CMOS integrated circuit. However, it is still difficult to obtain a clock signal having a frequency of 1 GHz by a direct means. Even if such a clock signal is obtained, it is not practical since it increases the power consumption of the CMOS integrated circuit.

Although it is difficult to directly produce clock signals having a frequency of 1 GHz, it is enough for many applications just to obtain clock pulses having a time interval of 1 ns. Such a clock pulse can be obtained by utilizing a ring oscillator in which a number of clock signal-producing circuits with a much lower frequency are operated successively at time intervals of 1 ns. Accordingly, consideration has been given to successively deriving clock pulses from respective stages of the ring oscillator. As mentioned above, however, it is still difficult to produce timing signals having a period equal to one even-numberth of the clock period. Meanwhile, signal processing in a digital circuit may preferably be conducted at a timing of $\frac{1}{2^n}$ of the period. Accordingly, when the signal processing is conducted at a timing other than $\frac{1}{2^n}$ of the period, namely at a timing of one odd-numberth of the period which is easily derived from a circuit utilizing a conventional ring oscillator, the data obtained as processing results should be corrected by using an appropriate coefficient as a multiplier. As a result, the precision of signal processing is greatly deteriorated and the signal processing has to have a complicated system.

SUMMARY OF THE INVENTION

An object of the present invention is to solve the above-mentioned problems and to provide an improved voltage-controlled oscillating circuit, wherein a timing signal having a period equal to one even-numberth of the oscillation period can be derived from a ring oscillator, which has only been able to produce a timing signal having such a period equal to one odd-numberth of the oscillation period.

Another object of the present invention is to provide a voltage-controlled oscillating circuit wherein a switch circuit controls the propagation delay of the switch circuit and even number (N) stages of inverter connected in a series so that a low logic-level signal is subjected to a propagation delay corresponding to N+1 stages and a high logic-level signal is subjected to a propagation delay corresponding to N−1 stages; wherein the oscillation is maintained.

A further object of the present invention is to provide a voltage-controlled oscillating circuit comprising a multi-staged phase inversion circuit composed of 4 or more even-number N stages of phase inversion device connected in a series, wherein a phase inversion delay time is controlled by means of an applied voltage, and a switch circuit having a delay time characteristic similar to that of the phase inversion circuit; wherein a switch output is at high logic level when outputs of phase inversion devices in the last stage and in the second stage from the last stage of said multi-staged phase inversion circuit are both at low logic level, while the switch output is at low logic level when the output of phase inversion device in the second stage from the last stage is at high logic level; wherein the output of the switch circuit is fed back to the input of the multi-staged phase inversion circuit so as to form an oscillating circuit; wherein a timing signal having a time interval of one-Nth of the oscillation period of the oscillating circuit can be taken out from respective phase inversion devices in respective stages of the multi-staged phase inversion circuit and the switch circuit.

Therefore, according to the present invention, there can be easily attained a timing signal having a period equal to one even-numberth of the clock period, which has been difficult to be derived from a conventional oscillating circuit, in the course of integral multiplication of a clock frequency by means of a phase locked loop (PLL) circuit. In particular, since a timing signal having a period of $\frac{1}{2^n}$ of the clock period can be easily obtained, high-speed processing of digital signals can be conducted with ease. Therefore, the voltage-controlled oscillating device according to the present invention can have a wide application to various technologies from digital video apparatus to computer networks.

For example, the voltage-controlled oscillating circuit according to the present invention can be applied to devices used in high energy physics experiments for processing output signals which are highly frequently detected by a detector and in synchronous circuits for high-resolution image displaying apparatus such as high definition television (HDTV). Some examples of electronic apparatus in which the voltage-controlled oscillating circuit of the present invention can be applied include the following:

High precision time-to-digital converter;

Synchronous circuit for video signals;

High-speed serial communication device;

Semiconductor testing device; and

Measuring device for distance between two cars.

BRIEF DESCRIPTION OF THE DRAWINGS

The present invention will be further explained in detail below with reference to the accompanying drawings, in which:

FIGS. 4B(A), 4B(B), 4B(C), 4B(D), 4B(E), 4B(F), 4B(G), 4B(H) and 4B(S) are waveform diagrams showing waveforms of pulses in respective stages of the oscillating circuit shown in FIG. 4A;

FIGS. 6(D1), 6(D2), 6(D3), 6(D4), 6(D5), 6(D6), 6(D7) and 6(D8) are waveform diagrams showing waveforms of pulses in respective stages of the oscillating device shown in FIG. 5.

Throughout different views of the drawings; PLL is a phase-locked loop, VO is a voltage-controlled oscillator, PC is a phase comparator, LF is a loop filter, IP is an input pulse, OP is an output pulse, f(t) is an external signal and $f(t_1)$, $f(t_2)$ are levels at time $t_1$ and time $t_2$ respectively, CK is a reference clock signal, $D_1, D_2, D_3 \ldots D_8$ are data output signal, $FF_1, FF_2, FF_3 \ldots FF_8$ are flip-flop circuits, $U_1, U_2, U_3 \ldots U_n$ are voltage controlled inverters, $M_1, M_2, M_3 \ldots M_8$ are MOS type transistors, A ... H, and S are output nodes, $U_S$ is a switch circuit, VGN is a control voltage signal, IN is an input terminal of the inverter, OUT is an output terminal of the inverter, VDD is a drain voltage, 1 is a ring oscillator, 2 is a last stage output of the ring oscillator, 3 is a first stage input of the ring oscillator.

DESCRIPTION OF THE PREFERRED EMBODIMENTS

The preferred embodiments of the present invention will be described in detail below referring to the attached drawings.

Figure 3A:
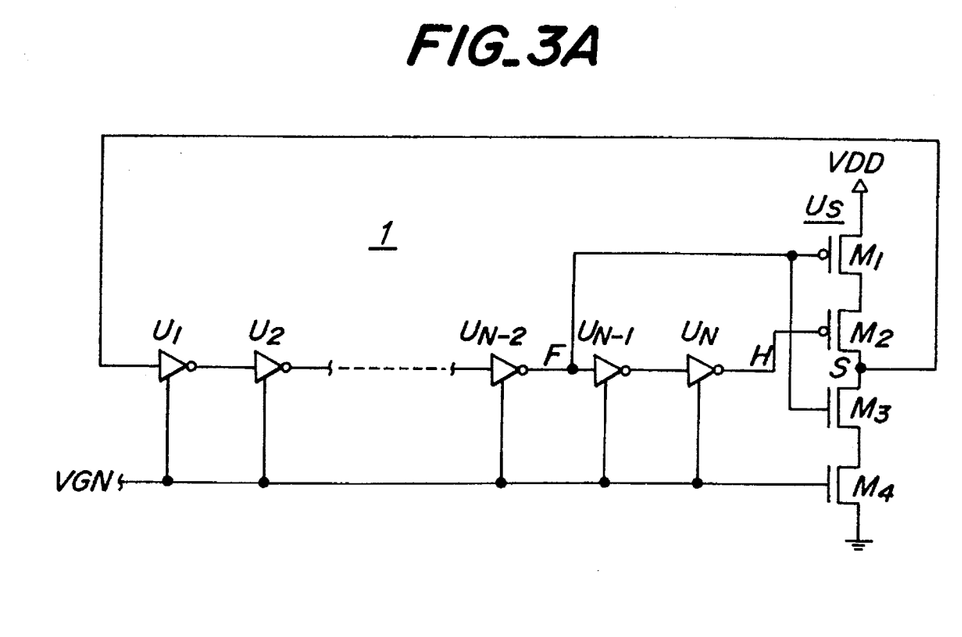
FIG. 3A is a circuit diagram illustrating a voltage-controlled oscillating circuit according to the present invention.

Referring now to FIG. 3A, there is shown a circuit diagram of a voltage-controlled oscillating circuit according to the present invention. In FIG. 3A, there is shown a ring oscillator which is constructed by connecting phase inverting devices $U_1$-$U_N$, namely inverters $U_1$-$U_N$ of an arbitrary even number (N) not less than 4 in series, and feeding output of a switch circuit $U_S$, which is connected to the last phase inverting device in the series, back to the input side of the phase-inverting devices connected in series. A controlling voltage VGN is applied to each inverter $U_1$-$U_N$ and to the switch circuit $U_S$ so as to change the delay time of phase inversion in each of the inverters $U_1$-$U_N$ and switch circuit $U_S$.

Figures 3B, 3C:
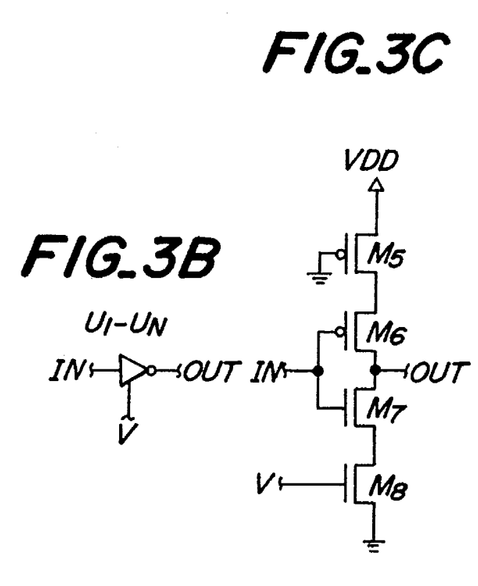
FIG. 3B is a circuit diagram illustrating an inverter in each stage of the oscillating circuit shown in FIG. 3A.
FIG. 3C is a circuit diagram illustrating a detailed constitution of inverters shown in FIG. 3B.

In fact, each of the voltage-controlled phase inverting devices $U_1$-$U_N$ shown in FIG. 3A is constituted by four MOS-type transistors $M_5$–$M_8$ connected in series as seen in FIG. 3C, similar to the switch circuit $U_S$ which is composed of four MOS-type transistors $M_1$–$M_4$ connected in series. With respect to the two transistors in the middle, however, their connections are different in that the gate electrodes of $M_2$ and $M_3$ are controlled individually in the switch circuit $U_S$, while the gate electrodes of $M_6$ and $M_7$ are connected in parallel. In order to take out a timing signal having a period that is exactly equal to one-Nth of the oscillation period T of the ring oscillator, it is important to equate the output load of each inverter with that of the switch circuit in addition to making respective inverters and the switch circuit have similar circuit constitutions. Therefore, a P-MOS transistor $M_5$ in each inverter corresponds to $M_1$ of the switch circuit, and is used as a dummy to equate the driving ability in the P-MOS transistor side with that of the switch circuit. Incidentally, the switch circuit $U_S$ operates similarly even when gate connections are reversed between MOS transistors $M_1$ and $M_2$.

Therefore, while a phase inversion occurs in each stage of inverters $U_1$-$U_N$, wherein the output pulse has a logic level inverted from that of the input pulse supplied to the gate electrode of a MOS transistor, the switch circuit $U_S$ operates in a manner similar to that of a NOR circuit, and thus the output pulse in node S of the switch circuit is at a high logic level when both the output pulse in node F of the stage $U_{N-2}$, i.e. the second stage from the last stage, and the output pulse in node H of the last stage $U_N$ are at low logic level, and the output pulse in node S of the switch circuit is at low logic level when the output pulse in node F of the stage $U_{N-2}$ is at high logic level. Accordingly, the phase of the output pulse which is fed back to the input side of the even-numbered inverters connected in series, is equal to the phase of the output pulse coming out of the odd-numbered inverters connected in series, thereby satisfying the oscillating conditions of a ring oscillator.

In this connection, N-MOS transistors $M_8$ and $M_4$ in respective inverters $U_1$-$U_N$ and in the switch circuit $U_S$ are control transistors for controlling the respective delay times in each of them. In fact, $M_8$ and $M_4$ only control the timing for trailing the output pulse. However, since the polarity of the output pulse is inverted at every succeeding stage in the phase inversion circuit, the timings for leading and trailing of the phase inversion can be controlled alternately.

Figure 4A:
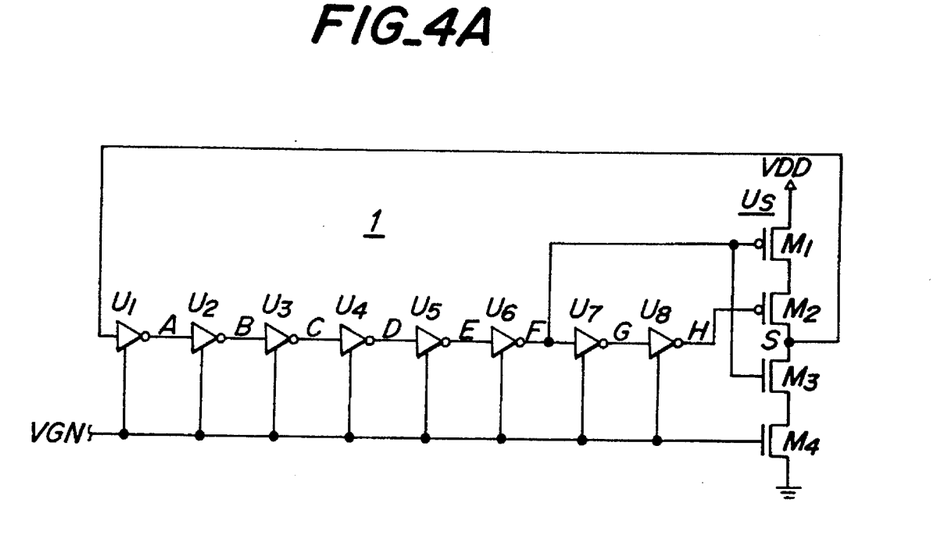
FIG. 4A is a circuit example of an 8 inverter stage illustrating a constitution of a voltage-controlled oscillating circuit according to the present invention.
Figure 4B:
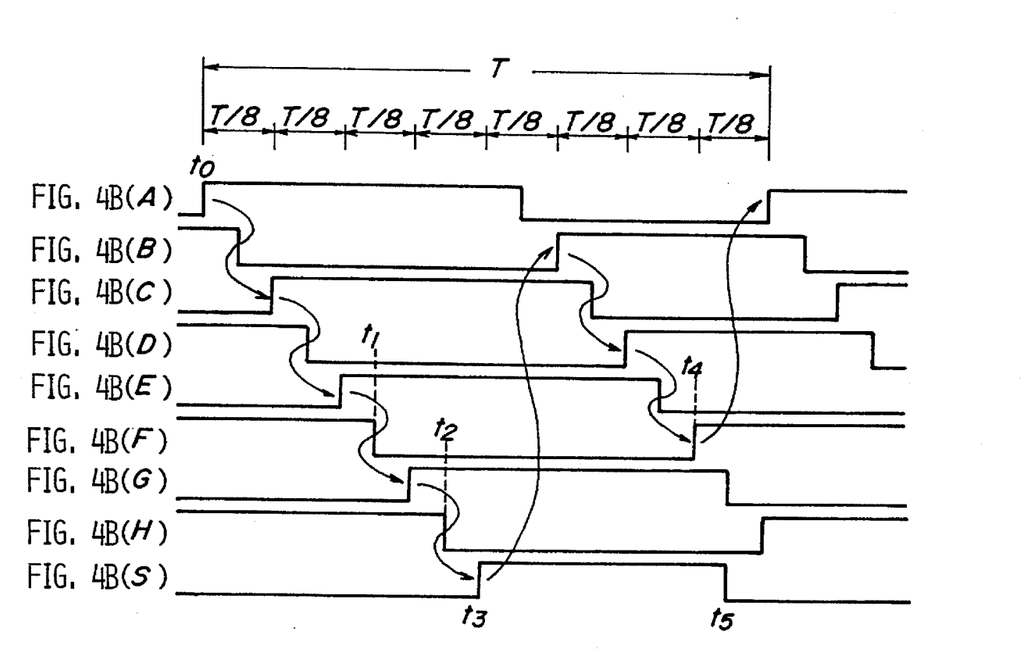

Next, with respect to an example of the voltage-controlled oscillating circuit, wherein the number N of inverters connected in a series is eight, the circuit constitution thereof is illustrated in FIG. 4A, and timing of the signal at each stage is successively shown in FIGS. 4B(A) to 4B(S). In the following, explanation will be given only on the timing of the leading edge in the phase inversion of the signal; however, almost the same is true of the timing for the trailing edge. Referring to the timing diagrams shown in FIGS. 4B(A) to 4B(S), in the case where the output pulse in node A of the inverter $U_1$ is at a high logic level at the time $t_0$, the leading edge is transferred to every other stage in the series, as illustrated by the arrows in the figure, with a time interval of T/8, i.e. one-eighth of the oscillation period T.

In this connection, an explanation will be made of the circuit operation of the switch circuit $U_S$. In the timing diagram of FIGS. 4B(A) to 4B(S), when the output node F of the inverter $U_6$ is at low logic level at the time of $t_1$, the MOS transistor $M_1$ of the switch circuit $U_S$ is in the ON state and MOS transistor $M_3$ is in the OFF state. In this case, however, the output node H of the inverter $U_8$ is at high logic level, and thus the MOS transistor $M_2$ is in the OFF state. As a result, the output node S of the switch circuit $U_S$ is in a floating state, thereby maintaining the immediately preceding low logic level. On the contrary, at the time $t_2$, when the output node H of the inverter $U_8$ is inverted to one at low logic level, the output node F of the inverter $U_6$ is still at low logic level. Accordingly, both $M_1$ and $M_2$ are in the ON state, and the output node S of the switch circuit $U_S$ goes, to high logic level at the time $t_3$ due to a phase inversion having occurred therein.

On the other hand, when the output node F of the inverter $U_6$ is at the high logic level at the time $t_4$, the MOS transistor $M_1$ is in the OFF state and MOS transistor $M_3$ is in the ON state. Accordingly, the output node S of the switch circuit $U_S$ is subjected to a phase inversion toward the low logic level at the time $t_5$ without waiting for the output node H of the inverter $U_8$ to be inverted to the high logic level.

As described above, in the voltage-controlled oscillating circuit according to the present invention, the signal in node S has experienced time delays at 9 stages, which are owing to respective phase inversions occurring in the inverters $U_1$-$U_8$ and the switch circuit $U_S$ with respect to the input signal at low logic level, while the output signal in node S has experienced time delays at 7 stages, which are owing to respective phase inversions occurred in the inverters $U_1$-$U_6$ and the switch circuit $U_S$ with respect to the input signal at high logic level. As a result, although the total time delay during one period T of a phase inversion signal includes even-numbered time delays occurred in 9+7=16 stages, oscillation caused by repeating phase inversions can be maintained because the phase inversion signal at low logic level and that at high logic level are respectively subjected to odd-numbered phase inversions. Accordingly, since the polarity of the phase inversion signal is reverted to the original one at every second stage in the series, it is possible to take out a timing pulse at time intervals equal to one-eighth of the phase inverting oscillation period T.

Figure 5:
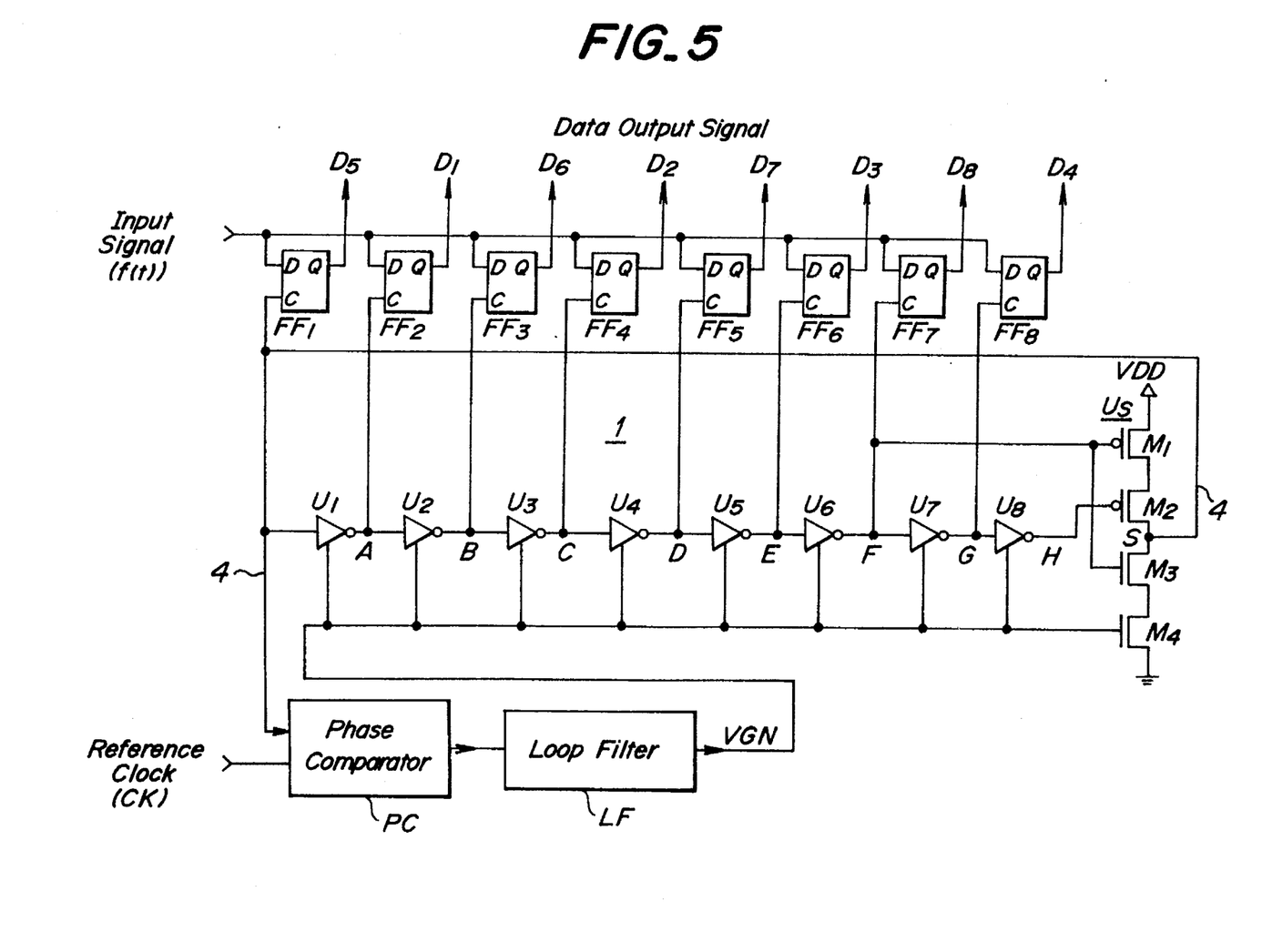
FIG. 5 is a circuit diagram showing an applied example of the oscillating circuit according to the present invention which utilizes a leading edge of respective inverters.
Figure 7:
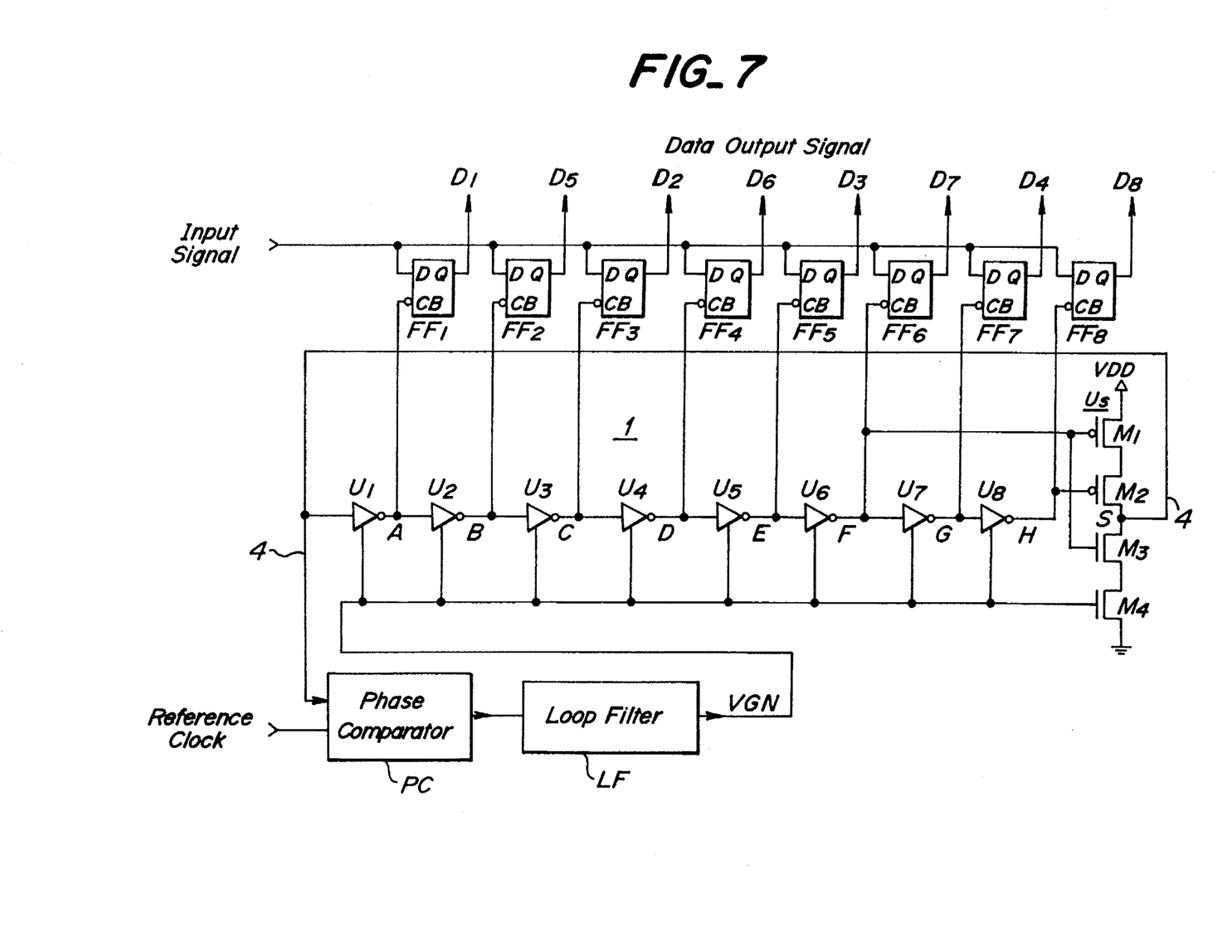
FIG. 7 is a circuit diagram showing another applied example of the oscillating circuit according to the present invention which utilizes a trailing edge of respective inverters.

In FIGS. 5 and 7, f(t) shows an external signal; CK is a reference clock signal; PC is a phase comparator; LF is loop filter; VGN is a control voltage; and $D_1$, $D_2$, $D_3$ ... $D_8$ respectively show a data output signal of flip-flop circuits $FF_1$-$FF_8$.

By combining respective flip-flop circuits $FF_1$-$FF_8$ with respective inverters $U_1$-$U_8$ of the oscillating circuit of the present invention as shown in FIGS. 5 and 7 in order to constitute a device wherein the external signal f(t) is successively latched by means of an output signal of each inverter, it becomes possible to detect the change in the external signal f(t) at time intervals of one-eighth of the period of the reference clock signal CK which is phase-locked by the PLL circuit utilizing the oscillating circuit according to the present invention.

Figure 6:
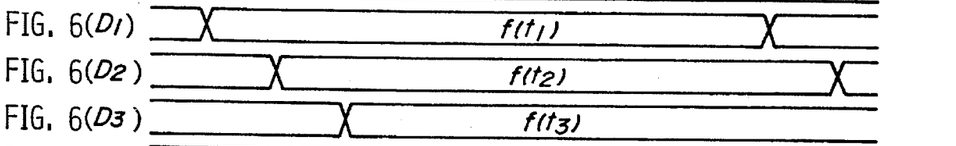

The operation of this circuit will be explained below. By constituting the phase-locked loop (PLL) circuit so that an output 4 of the voltage-controlled oscillating circuit 1 according to the present invention and the reference clock CK are connected to the input of the phase comparator PC, and the controlling voltage VGN is derived through the loop filter LF, the oscillating circuit 1 of the present invention can produce oscillations having a period equal to that of the reference clock signal CK under certain conditions. In this connection, since every other output signal of inverters $U_1$-$U_8$ and the switch circuit $U_S$ has a leading edge at intervals of one-eighth of the oscillation period T as described before referring to FIGS. 4B(A) to 4B(S), every other flip-flop circuit among $FF_1$-$FF_8$ may successively latch the logic level of the external signal f(t) as respective data outputs $D_1$, $D_2$, ..., $D_8$, $D_1$, ..., at the intervals of T/8 as shown in FIGS. 6(D1) to 6(D8). The data output $D_1$ has a level $f(t_1)$ of the external signal at the time of $t_1$, the data output $D_2$ has a level $f(t_2)$ of the external signal at the time of $t_2$, and so do the following data outputs $D_3$, ..., $D_8$. Accordingly, by examining the data outputs $D_1$-$D_8$, when the external signal f(t) is changed can be known with a preciseness of T/8.

Referring now to FIG. 7, there is shown another example of the oscillation device, which utilizes trailing edges of respective stages. The oscillation device of this example is different from that of FIG. 5 in positions at which the flip-flop circuits are connected, and respective flip-flop circuits $FF_1$–$FF_8$ latch the logic level of the external signal f(t) at respective trailing edges of the signals. In both oscillation devices shown in FIGS. 5 and 7, it is important to make respective stages have an equal load for maintaining the time intervals of the latch constant, for example, by incorporating a dummy capacity.

As is clear from the above explanation, while the voltage-controlled oscillating circuit, which has been conventionally used in a PLL circuit, has been applied thereto primarily for the purpose of utilizing the oscillation output signal whose phase is synchronous with that of the input signal; according to the present invention, timing signals can further be taken out at time intervals of 1/N (N is an even number) of the oscillation period. In particular, since timing signals having a time interval of $\frac{1}{2}^n$ of the oscillation period, if combined with counters which utilize oscillation output of the oscillating circuit according to the present invention as the input thereof, there can be attained such a remarkable effect that a high-speed, high-precision measurement can be continuously conducted for a long time without difficulty.

I claim:

1. A voltage-controlled oscillating circuit comprising a multi-staged phase inversion circuit composed of N stages of phase inversion devices connected in series, where N is an even-numbered integer equal to at least 4, wherein a phase inversion delay time is controlled by means of an applied voltage, in each of said phase inversion devices, and a switch circuit having a delay time characteristic similar to that of said inversion circuit; wherein a switch output is at high logic level when outputs of phase inversion devices in the last stage and in the second stage from the last stage of said multi-staged phase inversion circuit are both at low logic level, while said switch output is at low logic level when said output of the phase inversion device in the second stage from the last stage is at high logic level; where said output of said switch circuit is fed back to the input of said multi-staged phase inversion circuit so as to form an oscillating circuit; wherein a timing signal having a time interval of one-Nth of the oscillation period of said oscillating circuit is taken out from respective phase inversion devices in respective stages of said multi-staged phase inversion circuit and said switch circuit.

2. The voltage-controlled oscillating circuit according to claim 1, wherein timing signals having a time interval of one-Nth of the oscillation period respectively taken out from phase inversion devices in respective stages of said multi-staged phase inversion circuit and said switch circuit are respectively input to latch circuits, thereby successively detecting an external signal transition.

* * * * *